United States Patent
Tomikawa et al.

[11] Patent Number: 5,316,804
[45] Date of Patent: May 31, 1994

[54] PROCESS FOR THE SYNTHESIS OF HARD BORON NITRIDE

[75] Inventors: Tadashi Tomikawa; Nobuhiko Fujita; Shyoji Nakagama; Akira Nakayama, all of Itami, Japan

[73] Assignee: Sumitomo Electric Industries, Ltd., Osaka, Japan

[21] Appl. No.: 741,615

[22] Filed: Aug. 7, 1991

[30] Foreign Application Priority Data

Aug. 10, 1990 [JP] Japan .................. 2-210214
May 28, 1991 [JP] Japan .................. 3-123611

[51] Int. Cl.$^5$ .................. B05D 3/06; C23C 14/34
[52] U.S. Cl. .................. 427/569; 427/570; 427/573; 427/255.2; 427/255.1; 427/523; 204/192.15; 204/298.19; 204/298.21
[58] Field of Search .............. 427/255.2, 255.1, 248.1, 427/38, 39, 596, 569, 570, 523, 573; 204/192.15, 298.19, 298.21

[56] References Cited

U.S. PATENT DOCUMENTS

| | | | |
|---|---|---|---|
| 4,412,899 | 11/1983 | Beale | 204/192.15 |
| 4,565,747 | 1/1986 | Nakae et al. | 428/698 |
| 4,683,043 | 7/1987 | Melton et al. | 204/192.15 |
| 4,762,729 | 8/1988 | Hirano et al. | 427/38 |
| 4,973,494 | 11/1990 | Yamazaki | 427/39 |
| 5,096,740 | 3/1992 | Nakagama et al. | 427/587 |

*Primary Examiner*—Roy V. King
*Attorney, Agent, or Firm*—Wenderoth, Lind & Ponack

[57] ABSTRACT

There can be provided a novel and useful process for the synthesis of hard boron nitride consisting essentially of single phase cubic boron nitride by a gaseous phase synthesis technique, which comprises adding a F atom-containing gas to the gaseous phase or adding a F atom-containing gas and H atom-containing gas to the gaseous phase, whereby the codeposited hexagonal boron nitride can selectively be etched and hard boron nitride of substantially single phase can finally be synthesized.

13 Claims, 3 Drawing Sheets

PROCESS FOR THE SYNTHESIS OF HARD BORON NITRIDE

BACKGROUND OF THE INVENTION

1. Field of the Invention

This invention relates to a process for the synthesis of hard boron nitride having a very large hardness as well as high heat resistance. The hard boron nitride of the present invention can effectively be applied to the field needing excellent properties such as hardness, heat resistance, oxidation resistance, chemical stability, etc., e.g. cutting tools, wear resistance tools and the like.

2. Description of the Prior Art

The so-called hard boron nitrides such as cubic boron nitride and wurtzite boron nitride can be said to be ideal as a material for tools such as cutting tools, wear resistance tools, etc. because of having a hardness next to diamond and being excellent in heat resistance, oxidation resistance and chemical stability in comparison with diamond. However, since a superhigh pressure and high temperature are required for the synthesis of hard boron nitride, than in the case of diamond, the shape of the product is largely restricted and a very expensive superhigh pressure generating apparatus should be used, resulting in a high synthesis cost and a limitation on the range of use thereof.

As in the case of diamond, processes for the synthesis of hard boron nitride have lately been developed comprising depositing on the surface of a substrate from gaseous phase without using a superhigh pressure and high temperature. According to this gaseous phase synthesis technique, it is considered that the shape of the product is hardly limited and the synthesis cost is largely decreased because of using no superhigh pressure generating apparatus.

As the gaseous phase synthesis of hard boron nitride, there are proposed a number of methods, for example, ① an ion beam method comprising melting and vaporizing metallic boron by an HCD electron gun, reacting with nitrogen plasma in the ambient atmosphere and thus depositing and synthesizing boron nitride on the surface of a substrate, ② a reactive sputtering method comprising sputtering metallic boron with hydrogen or nitrogen, reacting with nitrogen plasma in the ambient atmosphere and thus depositing and synthesizing on the surface of a substrate and ③ a plasma CVD method comprising reacting diborane with nitrogen or ammonia in an atmosphere of high frequency such as microwave and depositing and synthesizing boron nitride on the surface of a substrate.

However, all the above described prior art methods have not succeeded in depositing and synthesizing cubic boron nitride or wurtzite boron nitride of single phase on a substrate from gaseous phase, but have obtained only a mixture of hard boron nitride of cubic or wurtzite type and hexagonal boron nitride of a thermodynamically low pressure phase. The hexagonal boron nitride is not suitable for a tool material because of its low hardness and accordingly, the gaseous phase synthesis boron nitride according to the prior art method has not been put to practical use as a tool material.

In view of the above conditions the present invention has been made for the purpose of providing a novel gaseous phase synthesis process for obtaining hard boron nitride on the surface of a substrate as a substantially single phase, which can practically be used as a tool material.

SUMMARY OF THE INVENTION

It is an object of the present invention to provide a process for the gaseous phase synthesis of hard boron nitride excellent in heat resistance, whereby the disadvantages of the prior art can be overcome.

It is another object of the present invention to provide a process for the gaseous synthesis of hard boron nitride on a substrate as a single phase, which can be put to practical use as a tool material.

These objects can be attained by a process for the synthesis of hard boron nitride, which comprises depositing hard boron nitride on the surface of a substrate from a gaseous phase containing F atoms or F atoms and H atoms.

BRIEF DESCRIPTION OF THE DRAWINGS

The accompanying drawings are to illustrate the principle and merits of the present invention in detail.

DETAILED DESCRIPTION OF THE INVENTION

Figure 1:
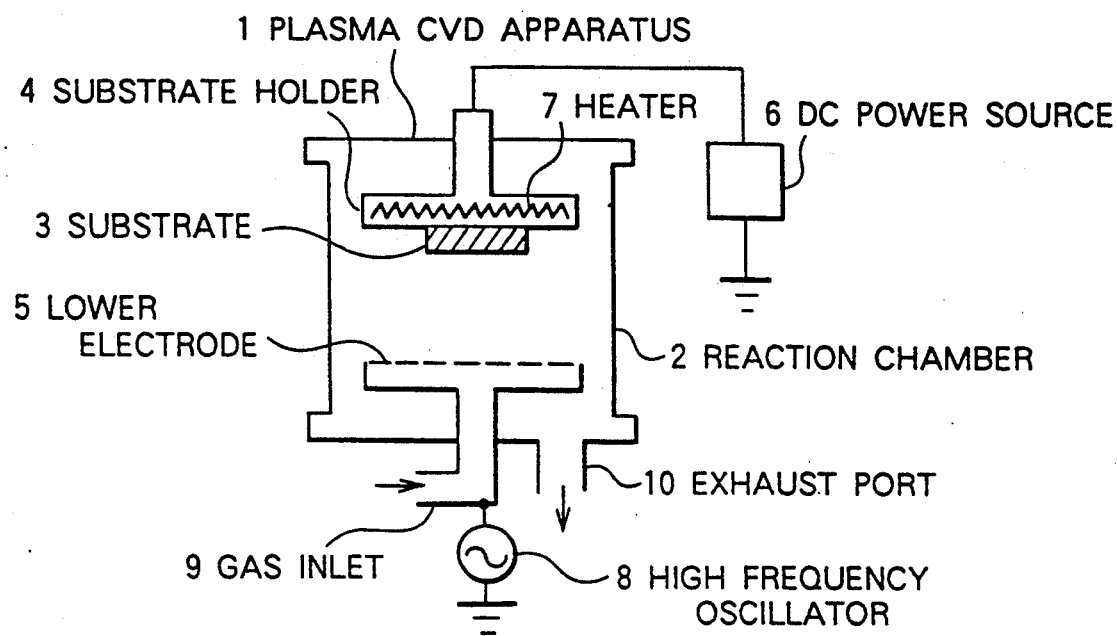
FIG. 1 is a schematic view of an RF plasma CVD apparatus comprising parallel plates, used in Examples 1 and 2 of the present invention.

A number of studies or proposals have been made for the purpose of synthesizing hard boron nitride of single phase by the gaseous phase synthesis technique as described above. All the studies or proposals have been directed to how to synthesize high pressure phase hard boron nitride, which is a non-equilibrium phase in view of thermodynamics, with a good yield at a low pressure. However, it is not known that satisfactory results are obtained thereby.

The inventors have considered from a completely different standpoint from the prior art that only a hard boron nitride can substantially be obtained on the surface of a substrate by not increasing the yield of hard boron nitride during gaseous phase synthesis, but selectively removing hexagonal boron nitride codeposited, and have made various efforts to realize this consideration. Consequently, it is found that the hexagonal boron nitride can selectively be etched by the use of a gas containing F (fluorine) atoms or a gas containing F atoms and H (hydrogen) atoms. The present invention is based on this finding.

That is to say, the first aspect of the present invention provides a process for the synthesis of hard boron nitride by depositing hard boron nitride on the surface of a substrate from gaseous phase, characterized in that a gas containing F atoms is used.

The second aspect of the present invention provides a process for the synthesis of hard boron nitride by depositing hard boron nitride on the surface of a substrate from gaseous phase, characterized in that a gas containing F atoms and H atoms is used.

Herein, the gaseous synthesis of hard boron nitride in the present invention can be carried out by any known means.

According to the present invention as described above, gaseous synthesis of hard boron nitride can be carried out by not increasing the yield of hard boron nitride during gaseous phase synthesis, but selectively etching and removing hexagonal boron nitride of low pressure phase which is thermodynamically an equilibrium phase and which is necessarily codeposited with the hard boron nitride during gaseous synthesis, and consequently, obtaining on the surface of a substrate hard boron nitride of single phase or with hexagonal boron nitride in such a small amount that practical use is not hindered.

According to the present invention, it is found that the selective etching of hexagonal boron nitride is difficult in the atmosphere of the gaseous phase synthesis of the prior art since there is no significant difference in chemcal properties between the hexagonal boron nitride and hard boron nitride, but the selective etching of boron nitride is rendered possible by using a gas containing F atoms to form an atmosphere of atomic F. As the gas containing F atoms, for example, there can be used $F_2$, $NF_3$, $BF_3$, etc.

In the present invention, the etching with atomic F is generally carried out by a method comprising subjecting a gas containing F atoms introduced into a gaseous phase to excitation and decomposition during gaseous phase synthesis by discharge phenomenon or radiation of electron ray, thus forming atomic F and chemically etching B and N in the boron nitride. Specifically, this is a method utilizing the energy difference between the F—B bond energy and F—N bond energy, and the B—N bond energy in the boron nitride.

In the present invention, furthermore, it is effective to use a gas containing H atoms as a raw material gas or additive gas simultaneously with a gas containing F atoms. That is, it is further found that hexagonal boron nitride can selectively be etched even by the use of a gas containing F atoms and a gas containing H atoms. As an example of the gas containing F atoms, there can be used the same materials as described above and as the gas containing H atoms, for example, there can be used $B_2H_6$, $NH_3$, $H_2$, etc. Combination of the both can suitably be chosen. Moreover, a gas containing both H atoms and F atoms can be used, for example, HF gas.

In the present invention, the etching by the use of a gas containing F atoms and a gas containing H atoms means generally a method comprising reacting the gas containing F atoms and the gas containing H atoms introduced in a gaseous phase during gaseous phase synthesis of hard boron nitride to form atomic H and atomic F and further form HF and chemically etching B and N in boron nitride with these atomic H, atomic F and HF. Specifically, this method utilizes an energy difference between the F—B and F—N bond energies and H—B and H—N bond energies, and the B—N bond energy in the boron nitride film.

Furthermore, an etching effect can be given to some extent by merely reacting the gas containing H atoms and the gas containing F atoms, but a higher etching effect can be obtained by exciting and decomposing them by discharge phenomenon or by radiation of electron beam.

In the present invention (used hereinafter to include both the first and second invention), the selective etching is carried out simultaneously with the gaseous synthesis, and the gaseous synthesis and selective etching can alternately be carried out with the similar benefits.

In the present invention, hexagonal boron nitride can be etched at a rate of about 10 to 100 times as high as the hard boron nitride (cubic boron nitride, wurtzite boron nitride) by the use of a gas containing F atoms or a gas containing F atoms and a gas containing H atoms (which will hereinafter be referred to as "F atom- and H atom-containing gas" including a gas containing F atom and H atom such as HF gas) and accordingly, hard boron nitride of single phase or with hexagonal boron nitride in such a small amount that practical use is not hindered can be synthesized on the surface of a substrate at a sufficient rate on a commercial scale.

The gaseous phase synthesis of the present invention can be carried out by any of known means as described above, for example, various CVD methods such as thermal CVD methods, DC plasma CVD methods, RF plasma CVD methods, etc., various PVD methods such as ion plating methods, ion beam methods, reactive sputtering methods, magnetron sputtering methods, IVD (ion vapor deposition) methods, etc.

The methods comprising adding a F atom-containing gas or F atom- and H atom-containing gas to a raw material gas during gaseous synthesis of the hard boron nitride by the plasma CVD method or ion beam method can be effected by a simple apparatus.

The plasma CVD method is generally carried out using a B-containing gas and N-containing gas as a raw material, but in some cases, the raw material can be supplied by vaporizing a solid material such as metallic B, amorphous B, h-BN, etc. or a liquid material containing B or N by high frequency heating and feeding to a film making chamber. The substrate temperature is preferably in the range of room temperature to about 1000° C. and the film making pressure is preferably adjusted to an order of $10^{-1}$ to $10^2$ Torr.

In particular, the use of a F atom-containing gas or F atom- and H atom-containing gas when the hard boron nitride is synthesized in gaseous phase by the thermal CVD method can be effected in a simple apparatus, enlargement of the area can readily be accomplished. The synthesis of the hard boron nitride by the thermal CVD method is carried out by feeding a gas containing B as a boron source, a gas containing N as a nitrogen source and a F atom-containing gas or F atom- and H atom-containing gas according to the present invention to a reaction furnace, reacting them in the reaction furnace and forming the hard boron nitride on a substrate. The boron source or nitrogen source can contain H atoms or F atoms. The substrate temperature is generally in the range of room temperature to 1000° C. and the film making pressure is generally in the range of $10^{-2}$ to $10^{+3}$ Torr order, but can be lowered to $10^{-4}$ Torr or lower.

On the other hand, the synthesis of the hard boron nitride by the ion beam method, ion plating method or sputtering method is generally carried out by using a solid material such as metallic B, amorphous B or h-BN and an N atom-containing gas such as nitrogen gas, as a raw material, at a substrate temperature of room temperature to about 1000° C. and a film making pressure of $10^{-5}$ to $10^{-2}$.

In the high frequency plasma CVD method such as using RF, microwave or ECR, a B-containing gas and N atom-containing gas are generally used as a raw material, but the raw material can be supplied to a film-making chamber by vaporizing a solid material such as metallic B, amorphous B, h-BN, etc. by high frequency or by bubbling a liquid raw material containing B atom or N atom using a carrier gas. The substrate temperature is generally room temperature to about 1000° C. and the film-making pressure is an order of $10^{-1}$ to $10^2$.

In the present invention, the amount of a F atom-containing gas to be used or to be added or the amount of a F atom- and H atom-containing gas to be used or to be added can suitably be determined depending upon the gaseous phase synthesis method to be employed. The specific hard boron nitride synthesis conditions depend on the method employed and according to each of the film-making conditions, to a film-making chamber are fed F atoms in an amount of about one to 100 times as many as B fed onto a substrate, or H atoms and F atoms in an amount of about one to 100 times as many as B fed onto the substrate. If the number of F atoms fed or the number of H atoms fed are too large, the film-making rate of the hard boron nitride is lowered, which is not commercially preferable, while if they are too small, etching of hexagonal boron nitride is not sufficient to retain it in a large amount, which is not preferable.

As illustrated above, according to the present invention, there can be provided a novel and useful process for the synthesis of hard boron nitride by a gaseous phase synthesis technique, which comprises adding a F atom-containing gas to the gaseous phase or adding a F atom-containing gas and H atom-containing gas to the gaseous phase, whereby the codeposited hexagonal boron nitride can selectively be etched and hard boron nitride of substantially single phase can finally be synthesized.

The following examples are given in order to illustrate the present invention in detail without limiting the same.

EXAMPLE 1 AND COMPARATIVE EXAMPLE 1

Using an RF plasma CVD apparatus with parallel plates, as shown in FIG. 1, the present invention was compared with the prior art. An Si substrate 3 was fitted to a substrate holder 4, a reaction chamber 2 was exhausted to at most $3 \times 10^{-4}$ Torr by the action of an evacuation means (not shown) connected with an exhaust port 10 and the Si substrate 3 was heated to 650° C. by a heater 7. Into the reaction chamber 2 were introduced diborane gas of 0.1 sccm, ammonia gas of 4 sccm, $H_2$ of 100 sccm and $F_2$ of 2 sccm from a gas feed inlet 9 and the pressure of the reaction chamber 2 was maintained at 30 Torr by controlling a conductance valve (not shown) provided to the exhaust port 10. Thereafter, an RF power source oscillator 8 of 13.56 MHz, connected to a lower electrode 5, was operated to supply an RF power of 300 W and to form a plasma between the substrate holder 4 and lower electrode 5. Further, a DC power source 6 connected to the substrate holder 4 was operated to apply a DC bias voltage of −400 V to the substrate holder 4. Under this state, boron nitride was deposited on the substrate for 1 hour.

When the resulting coating was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 1).

For comparison, the substrate was coated with boron nitride for 1 hour under the same conditions as described above except not introducing $F_2$ gas in the above described procedure and the product was subjected to the similar analysis. In the infrared absorption spectrum, absorption by cubic boron nitride was predominant, but absorption by hexagonal boron nitride was also found and in the transmission electron beam diffraction, the diffraction line of hexagonal boron nitride was observed (Comparative Example 1).

Figure 5:
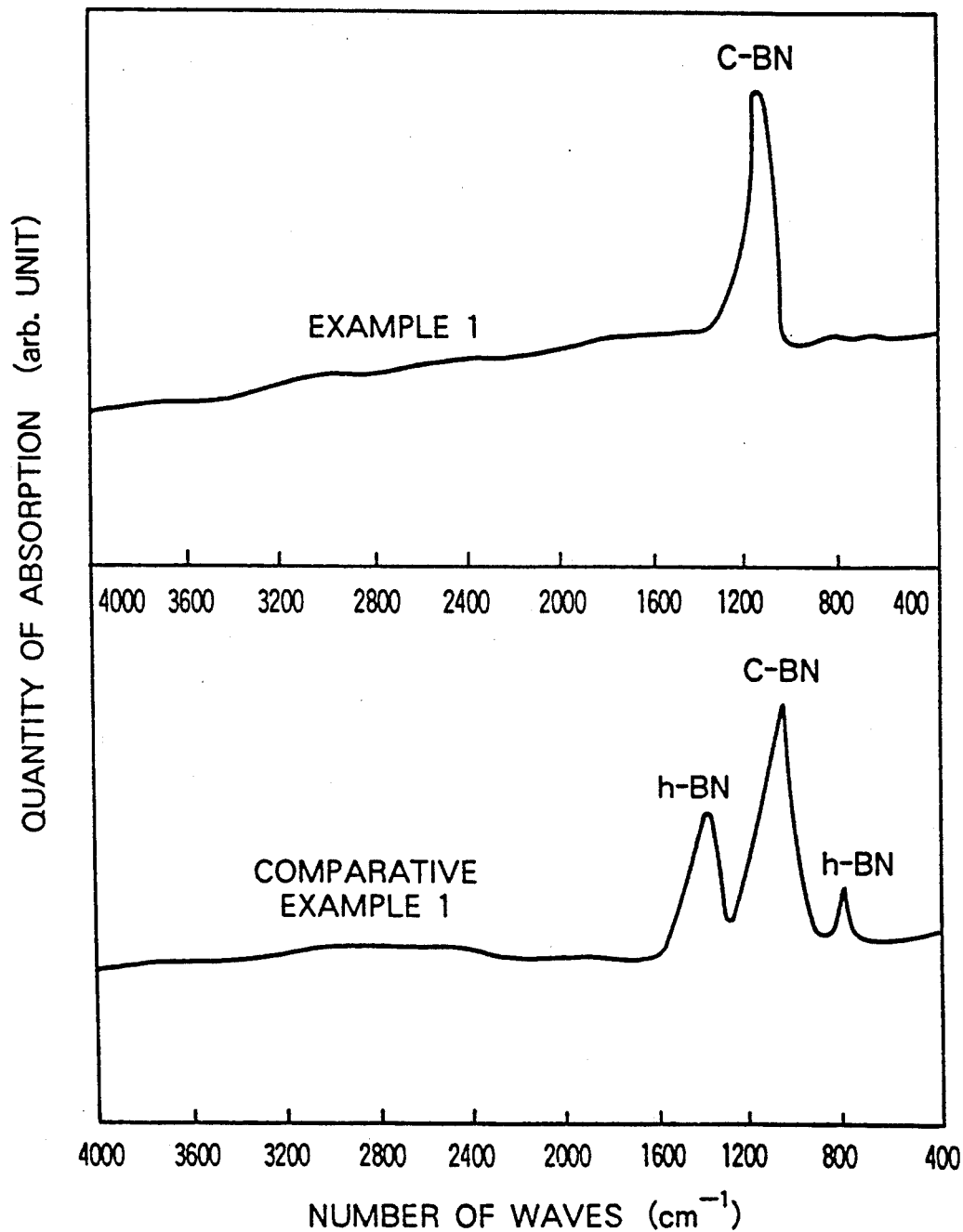
FIG. 5 is a graph showing infrared spectra of coatings respectively obtained in Example 1 and Comparative Example 1 for comparison.

FIG. 5 shows the infrared absorption spectra of the coatings obtained in Example 1 and Comparative Example 1 for comparison, in which the abscissa is the wave number ($cm^{-1}$) and the ordinate is the quantity of the absorption.

EXAMPLE 2 AND COMPARATIVE EXAMPLE 2

Using an RF plasma CVD apparatus with parallel plates, as shown in FIG. 1, the present invention was compared with the prior art. An Si substrate 3 was fitted to a substrate holder 4, a reaction chamber 2 was exhausted to at most $3 \times 10^{-4}$ Torr by the action of an evacuation means (not shown) connected with an exhaust port 10 and the Si substrate 3 was heated to 700° C. by a a heater 7. Into the reaction chamber 2 were then introduced diborane gas of 0.2 sccm, ammonia gas of 1 sccm, $H_2$ of 100 sccm and $F_2$ of 4 sccm from a gas feed inlet 9 and the pressure of the reaction chamber 2 was maintained at 40 Torr by controlling a conductance valve (not shown) provided to the exhaust port 10. Thereafter, the similar procedure to Example 1 was conducted to deposit boron nitride on the substrate.

When the resulting coating was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 2).

For comparison, the substrate was coated with boron nitride for 1 hour under the same conditions as described above except not introducing $F_2$ gas in the above described procedure and the product was subjected to the similar analysis. In the infrared absorption spectrum, absorption by cubic boron nitride was predominant, but absorption by hexagonal boron nitride was also found and in the transmission electron beam diffraction, the diffraction line of hexagonal boron nitride was observed (Comparative Example 2).

EXAMPLE 3 AND COMPARATIVE EXAMPLE 3

Figure 2:
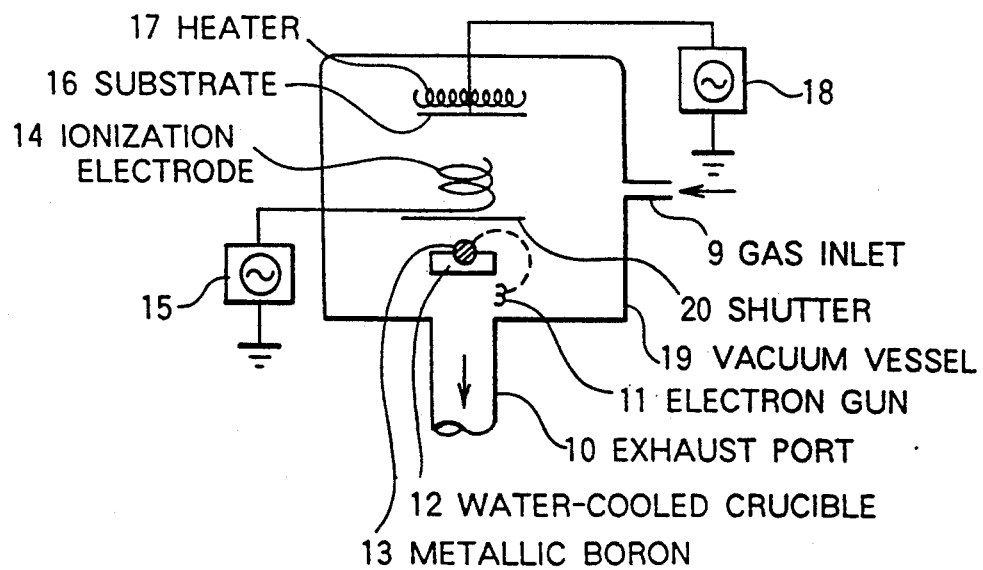
FIG. 2 is a schematic view of an RF ion plating apparatus used in Examples 3 and 4 of the present invention.

Using an RF ion plating apparatus shown in FIG. 2, metallic boron 13 held by a water-cooling crucible 12 was melted and vapoprized by an electron gun 11. A vacuum vessel 19 was evacuated to $3 \times 10^{-4}$ Torr by an evacuating means (not shown) connected to an exhaust port 10. Thereafter, a shutter 20 was opened and nitrogen gas of $3 \times 10^{-3}$ Torr and $NF_3$ gas of $1 \times 10^{-3}$ Torr were respectively introduced from a gas feed inlet 9, during which an ionization electrode 14 was connected with a first RF oscillator 15 of 13.56 MHz to convert the nitrogen gas and $NF_3$ gas into plasma state. An Si substrate 16 was heated at 650° C. by a heater 17 and an RF of 13.56 MHz and 100 W was applied to the substrate 16. 18 designates a second RF oscillator. Under this state, boron nitride was deposited on the substrate for 2 hours.

When the resulting coating was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 3).

For comparison, the substrate was coated with boron nitride for 1 hour under the same conditions as described above except not introducing NF$_3$ gas in the above described procedure and the product was subjected to the similar analysis. In the infrared absorption spectrum, absorption by cubic boron nitride was predominant, but absorption by hexagonal boron nitride was also found more and in the transmission electron beam diffraction, the diffraction line of hexagonal boron nitride was observed (comparative Example 3).

EXAMPLE 4 AND COMPARATIVE EXAMPLE 4

Using an RF ion plating apparatus shown in FIG. 2, metallic boron 13 held by a water-cooling crucible 12 was melted and vaporized by an electron gun 11. A vacuum vessel 19 was evacuated to $3 \times 10^{-4}$ Torr by an evacuatting means (not shown) connected to an exhaust port 10. Thereafter, a shutter 20 was opened and NF$_3$ gas of $2 \times 10^{-3}$ Torr and H$_2$ gas of $4 \times 10^{-3}$ Torr were respectively introduced from a gas feed inlet 9, during which an ionization electrode 14 was connected with a first RF oscillator 15 of 13.56 MHz to convert the NF$_3$ gas and H$_2$ gas into plasma state. An Si substrate 16 was heated at 600° C. by a heater 17 and an RF of 13.56 MHz and 100 W was applied to the substrate 16. 18 designates a second RF oscillator. Under this state, boron nitride was deposited on the substrate for 2 hours.

When the resulting coating was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 4).

For comparison, the substrate was coated with boron nitride for 2 hour under the same conditions as described above except introducing N$_2$ gas instead of the NF$_3$ gas in the above described procedure and the product was subjected to the similar analysis. In the infrared absorption spectrum, absorption by cubic boron nitride was predominant, but absorption by hexagonal boron nitride was also found more and in the transmission electron beam diffraction, the diffraction line of hexagonal boron nitride was observed (Comparative Example 4).

EXAMPLE 5 AND COMPARATIVE EXAMPLE 5

Figure 3:
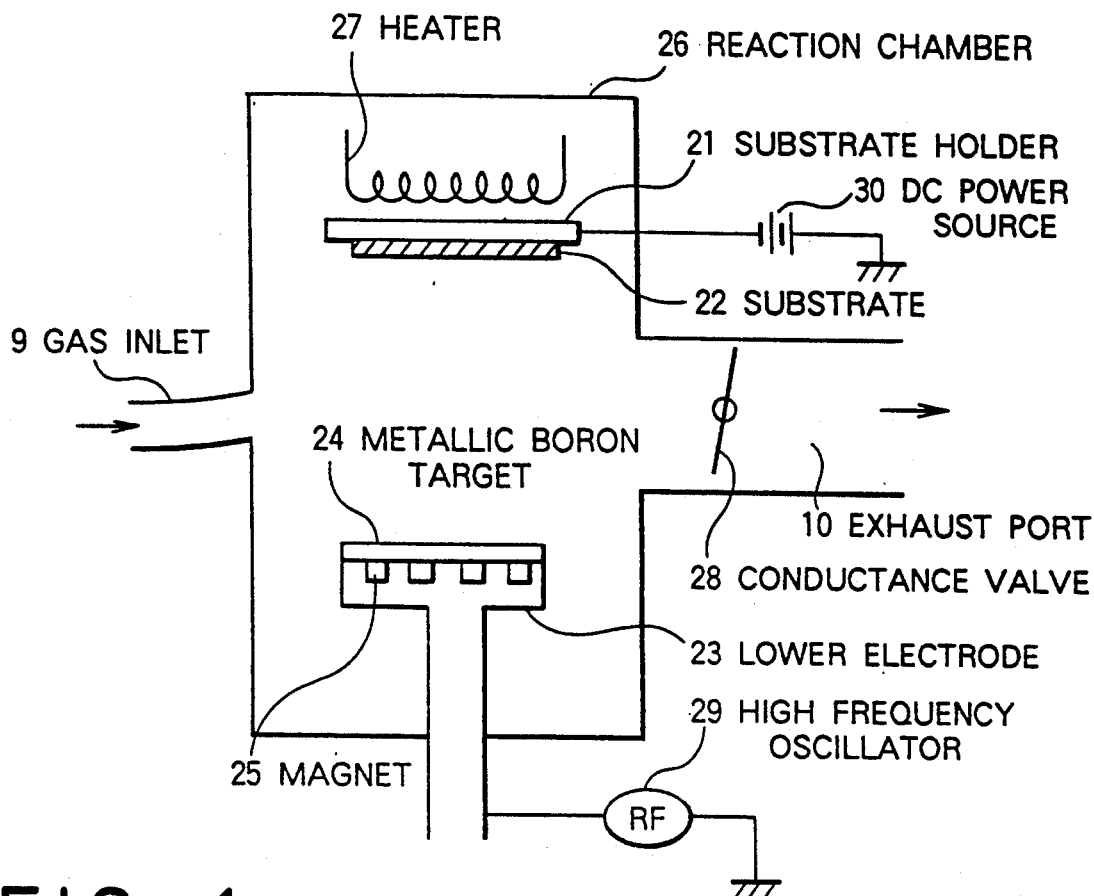
FIG. 3 is a schematic view of a sputtering apparatus used in Examples 5 and 6 of the present invention.

Using a sputtering apparatus, as shown in FIG. 3, the present invention was compared with the prior art. A stainless steel substrate 22 was fitted to a substrate holder 21, metallic boron 24 as a target was fitted to a lower electrode 23, a reaction chamber 26 was evacuated to at most $3 \times 10^{-4}$ Torr by the action of an evacuation means (not shown) connected with an exhaust port 10 and the stainless steel substrate 22 was heated to 700° C. by a heater 27. Into the reaction chamber 26 were then introduced nitrogen gas of 5 sccm and F$_2$ gas of 2 sccm from a gas feedinlet 9 and the pressure of the reaction chamber 26 was maintained at $5 \times 10^{-2}$ Torr by controlling a conductance valve 28 provided at the exhaust port 10. Thereafter, an RF power source oscillator 29 of 13.56 MHz, connected to the lower electrode 23, was operated to supply an RF power of 500 W and to form a plasma between the substrate holder 21 and lower electrode 23. Further, a DC power source 30 connected to the substrate holder 21 was operated to apply a DC bias voltage of $-200$ V to the substrate holder 21. Under this state, boron nitride was deposited on the stainless steel substrate for 1 hour. A magnet 25 was provided under the metallic boron target 24 to increase the sputtering efficiency.

When the resulting thin film was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 5).

For comparison, the substrate was coated with boron nitride for 1 hour under the same conditions as described above except not introducing F$_2$ gas in the above described procedure and the product was subjected to the similar analysis. In the infrared absorption spectrum, absorption by cubic boron nitride was predominant, but absorption by hexagonal boron nitride was also found and in the transmission electron beam diffraction, the diffraction line of hexagonal boron nitride was observed (Comparative Example 5).

EXAMPLE 6 AND COMPARATIVE EXAMPLE 6

Using a sputtering apparatus, as shown in FIG. 3, the present invention was compared with the prior art. A stainless steel substrate 22 was fitted to a substrate holder 21, metallic boron 24 as a target was fitted to a lower electrode 23, a reaction chamber 26 was evacuated to at most $3 \times 10^{-4}$ Torr by the action of an evacuation means (not shown) connected with an exhaust port 10 and the stainless steel substrate 22 was heated to 650° C. by a heater 27. Into the reaction chamber 26 were then introduced nitrogen gas of 2 sccm, H$_2$ gas of 4 4 sccm and F$_2$ gas of 4 sccm from a gas feed inlet 9 and the pressure of the reaction chamber 26 was maintained at $4 \times 10^{-2}$ Torr by controlling a conductance valve 28 provided at the exhaust port 10. Thereafter, an RF power source oscillator 29 of 13.56 MHz, connected to the lower electrode 23, was operated to supply an RF power of 500 W and to form a plasma between the substrate holder 21 and lower electrode 23. Further, a DC power source 30 connected to the substrate holder 21 was operated to apply a DC bias voltage of $-200$ V to the substrate holder 21. Under this state, boron nitride was deposited on the stainless steel substrate for 1 hour. A magnet 25 was provided under the metallic boron target 24 to increase the sputtering efficiency.

When the resulting thin film was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 6).

For comparison, the substrate was coated with boron nitride for 1 hour under the same conditions as described above except not introducing H$_2$ gas and F$_2$ gas in the above described procedure and the product was subjected to the similar analysis. In the infrared absorption spectrum, absorption by cubic boron nitride was predominant, but absorption by hexagonal boron nitride was also found and in the transmission electron beam diffraction, the diffraction line of hexagonal boron nitride was observed (Comparative Example 6).

EXAMPLE 7 AND COMPARATIVE EXAMPLE 7

Figure 4:
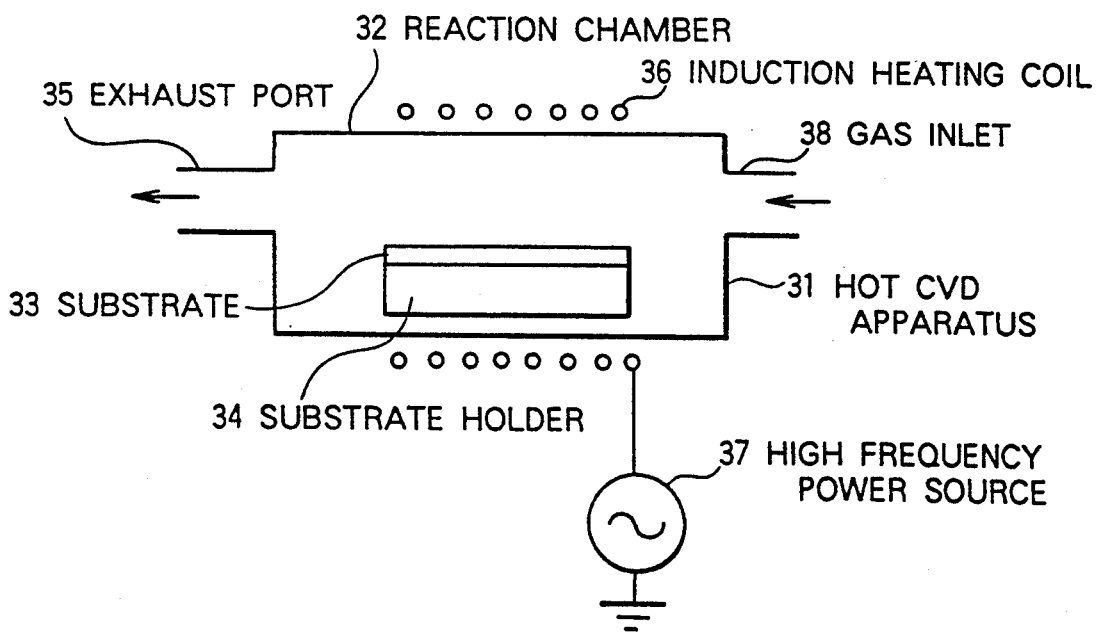
FIG. 4 is a schematic view of a thermal CVD apparatus used in Examples 7 of the present invention.

Using a thermal CVD apparatus, as shown in FIG. 4, the present invention was compared with the prior art. A Si substrate 33 was fitted to a substrate holder 34 and a reaction chamber 32 was evacuated to at most $3 \times 10^{-4}$ Torr by the action of an evacuation means (not shown) connected with an exhaust port 10. The substrate holder 34 was heated by supplying an induction heating coil 36 with high frequency from a high frequency power source 37 to maintain the Si substrate 33 at 800° C. Into the reaction chamber 32 were then introduced $B_2H_6$ gas of 0.1 sccm, $NH_3$ gas of 2 sccm, $H_2$ gas Of 100 sccm and $F_2$ gas of 20 sccm from a gas feed inlet 9 and the pressure of the reaction chamber 32 was maintained at 0.1 Torr by controlling a conductance valve (not shown) provided in the exhaust port 10 and boron nitride was deposited on the substrate for 4 hours.

When the resulting coating was subjected to measurement of infrared absorption spectrum, no absorption was found by hexagonal boron nitride, but only absorption by cubic boron nitride was found. When it was subjected to transmission electron beam diffraction, only the diffraction line of cubic boron nitride was found (Example 7).

For comparison, the substrate was coated with boron nitride for 4 hours under the same conditions as described above except not introducin $F_2$ gas in the above described procedure and the product was subjected to the similar analysis. In the infrared absorption spectrum, only absorption by hexagonal boron nitride was observed and formation of cubic boron nitride was not found and in the transmission electron beam diffraction, only the diffraction line of hexagonal boron nitride was observed and formation of cubic boron nitride was not found (Comparative Example 7).

It will clearly be understood from the above described Examples and Comparative Examples that gaseous phase synthesis of hard boron nitride of substantially single phase can be carried out on a substrate by a simple apparatus according to the present invention.

What is claimed is:

1. A process for the gaseous synthesis of hard boron nitride films which comprises depositing a hard boron nitride film consisting of cubic boron nitride of substantially a single phase on the surface of a substrate from a gaseous phase containing F atoms.

2. A process for the gaseous synthesis of hard boron nitride film which comprises depositing a hard boron nitride film consisting of cubic boron nitride of substantially a single phase on the surface of a substrate from a gaseous phase containing F atoms and H atoms.

3. The process as claimed in claim 1 or claim 2, wherein the source of the F atoms is at least one member selected from the group consisting of $F_2$, $NF_3$, $BF_3$ and HF.

4. The process as claimed in claim 2, wherein the source of the H atoms is at least one member selected from the group consisting of $B_2H_6$, $NH_3$, $H_2$ and HF.

5. The process as claimed in claim 1 or claim 2, wherein the depositing of the hard boron nitride is carried out by a DC plasma CVD method, RF plasma CVD method, beam reactive sputtering method or magnetron sputtering method.

6. The process as claimed in claim 5, wherein the DC or RF plasma CVD method is carried out by the use of a B-containing gas and N-containing gas.

7. The process as claimed in claim 5, wherein the DC or RF plasma CVD method is carried out by the use of a solid material selected from the group consisting of metallic B, amorphous B and hexagonal boron nitride (h-BN).

8. The process as claimed in claim 5, wherein the DC or RF plasma CVD method is carried out by the use of a liquid material containing B and N.

9. The process as claimed in claim 1 or claim 2, wherein the source of the F atoms is added to a raw material gas during the gaseous synthesis of said hard boron nitride.

10. The process as claimed in claim 1 or claim 2, wherein the source of the F atoms and the source of the H atoms are added to a raw material gas during the gaseous synthesis of said hard boron nitride.

11. The process as claimed in claim 5, wherein the reactive or magnetron sputtering method is carried out by the use of a solid material selected from the group consisting of metallic B, amorphous B and h-BN and an N-containing gas.

12. The process as claimed in claim 1, wherein the F atoms are present in an amount of one to 100 times as many as B atoms in the gaseous phase.

13. The process as claimed in claim 2, wherein the F atoms and H atoms are present in an amount of one to 100 times as many as B atoms in the gaseous phase.

* * * * *